(12) United States Patent
Chang et al.

(10) Patent No.: US 7,288,798 B2
(45) Date of Patent: Oct. 30, 2007

(54) LIGHT MODULE

(75) Inventors: Chih-Chin Chang, Hsin-Chu (TW); Teng-Huei Huang, Hsin-Chu Hsien (TW); Chien-Lung Lee, Nan-Tou Hsien (TW)

(73) Assignee: Lighthouse Technology Co., Ltd, Hsin-Chu Industrial Park, Hu-kou, Hsin-Chu Hsien (TW)

( * ) Notice: Subject to any disclaimer, the term of this patent is extended or adjusted under 35 U.S.C. 154(b) by 223 days.

(21) Appl. No.: 10/908,977

(22) Filed: Jun. 2, 2005

(65) Prior Publication Data

US 2006/0274524 A1    Dec. 7, 2006

(51) Int. Cl.
    *H01L 29/22* (2006.01)
(52) U.S. Cl. .................... 257/99; 257/100; 257/714
(58) Field of Classification Search ............ 257/89, 257/98, 99, 100, 714, 721
    See application file for complete search history.

(56) References Cited

U.S. PATENT DOCUMENTS

| 3,875,456 | A | * | 4/1975 | Kano et al. | ................. | 313/501 |
| 4,961,106 | A | * | 10/1990 | Butt et al. | ................. | 257/710 |
| 6,881,980 | B1 | * | 4/2005 | Ting | ........................... | 257/81 |
| 7,157,743 | B2 | * | 1/2007 | Kaneko | ..................... | 257/98 |

* cited by examiner

*Primary Examiner*—Mark V. Prenty
(74) *Attorney, Agent, or Firm*—Winston Hsu

(57) ABSTRACT

Disclosed herein is a light module comprising a substrate, at least one light-emitting element on the substrate, a sealing cap on the substrate and covering the light-emitting elements, and a fluid in the space formed among the sealing cap, the light-emitting elements, and the substrate, such that heat dissipation is fast and yellowing of the encapsulating material is retarded.

17 Claims, 4 Drawing Sheets

LIGHT MODULE

BACKGROUND OF INVENTION

1. Field of the Invention

The present invention relates to a light module, and more particularly to a high-power light module packaged with both solid and fluid packaging materials.

2. Description of the Prior Art

A cold illumination LED has the advantages of low power consumption, long device lifetime, no idling time, and quick response speed. In addition, since the LED also has the advantages of small size, suitability for mass production, and ease of fabrication as a tiny device or an array device, it has been widely applied in display apparatus and indicating lamps used in information, communication, consumer electronic products, and automotive industry, such as, cellular phones, as backlights of personal data assistants, outdoor traffic signal lamps or various outdoor displays, even as a components in the highly popular liquid crystal displays.

FIGS. 1 and 2 are each a cross section diagram showing a conventional LED module, respectively. As shown in FIG. 1, the conventional LED module includes a substrate 10, a plurality of LED units 12 positioned above the substrate 10, and an encapsulating material layer 14 disposed on the LED unit 12. As shown in FIG. 2, the conventional LED module includes a substrate 16, an insulating layer 18, a printed circuit board 20 positioned above the substrate 16, and a plurality of LED package bodies 22 disposed on the printed circuit board 20 and electrically connected to the printed circuit board 20. The LED package body 22 is constructed by forming the encapsulating material layer 24 via molding or sealant injection, and the entire LED module is then formed by aggregating each of the LED package bodies 22 on the substrate 16.

In conventional techniques, the substrate can be a lead frame or a printed circuit board (PCB), and a singular or plural LED chips are fixed onto the substrate. The encapsulating material layer is composed of mixtures containing resin, wavelength converting materials, fluorescent powder, and/or light-diffusing materials and packaged onto the substrate by a molding or sealant injection method. In order to protect the LED chip and wires, the encapsulating material layer is composed primarily of robust and enduring materials. Hence, it is disadvantageous that as the encapsulating material layer gets more rigid, the stress level of the overall package structure will increase accordingly, which will easily cause the encapsulating material layer to break in half or detach from the substrate and decrease the reliability of the product. Furthermore, the conventional encapsulating material layer has poor heat dissipation ability and a poor UV resistance, and thus a yellowing is likely to occur.

In case that the entire LED module is formed by aggregating a plurality of LED package bodies on the substrate, the volume of the resulted LED module will be relatively large and heat dissipation is still poor, resulting a short life time. With respect to the package with a singular or plural LED chips fixed onto a substrate which may be a lead frame or a printed circuit board (PCB), the substrate supporting chips is usually large and comprises of heat conductive or further electric conductive material. The packaging is performed by a molding or sealant injection method. Thus, the volume after packaging is much larger than a general LED. The encapsulating material still has disadvantages of tending to be yellowing and having low heat dissipation properties.

Therefore, a good LED package structure is still needed.

SUMMARY OF INVENTION

An objective of the present invention is to provide a light module used as a light source and having advantages of fast heat dissipation, not easy for yellowing, low mechanical stress, and high reliability.

The light module according to the present invention comprises a substrate, at least one light-emitting element on the substrate, a sealing cap on the substrate and covering the light-emitting elements, and a fluid in a space formed among the sealing cap, the light-emitting elements, and the substrate.

In one embodiment of the present invention, the light module may comprise a plurality of LED chips as light-emitting elements electrically connected to each other. In another embodiment of the present invention, the light-emitting elements may be a plurality of LED package bodies electrically connected to each other.

Since a fluid material with a free-flow ability is used in the light module according to the present invention, the heat generated by the light-emitting elements, such as diode chips or diode package bodies, can be easily dissipated by means of fluid flow (convection). Therefore, in addition to the heat dissipation path beneath the light-emitting elements as that used in a conventional structure, a heat dissipation path above the light-emitting elements is further constructed in the LED module according to the present invention. Accordingly, heat dissipation is fast and yellowing of the packaging or encapsulating material is retarded.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
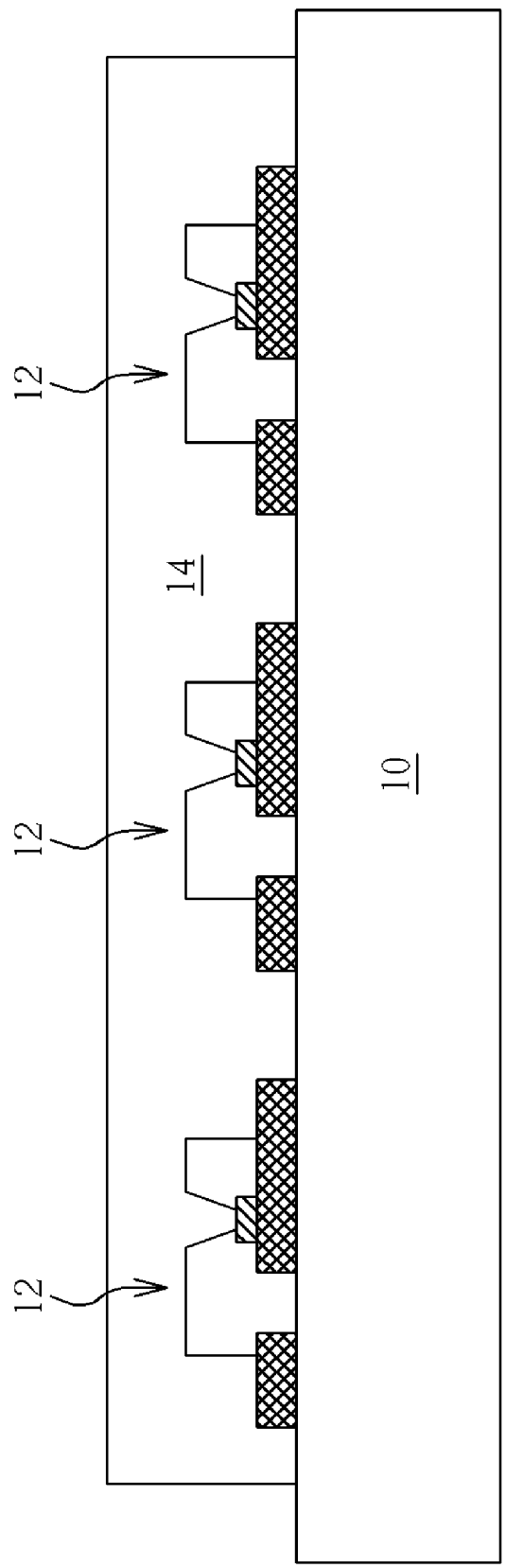
FIG. 1 is a schematic cross-sectional diagram showing a conventional LED module.
Figure 2:
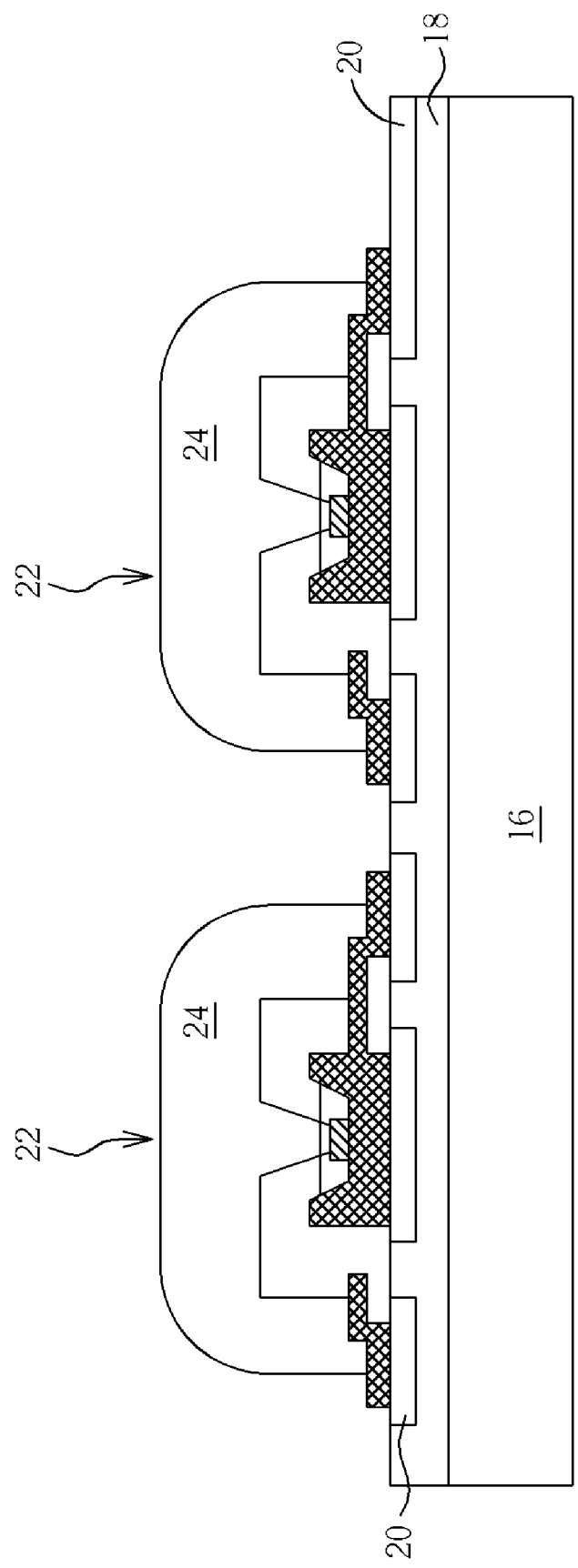
FIG. 2 is a schematic cross-sectional diagram showing a conventional LED module containing a plurality of singular LED package bodies.
Figure 3:
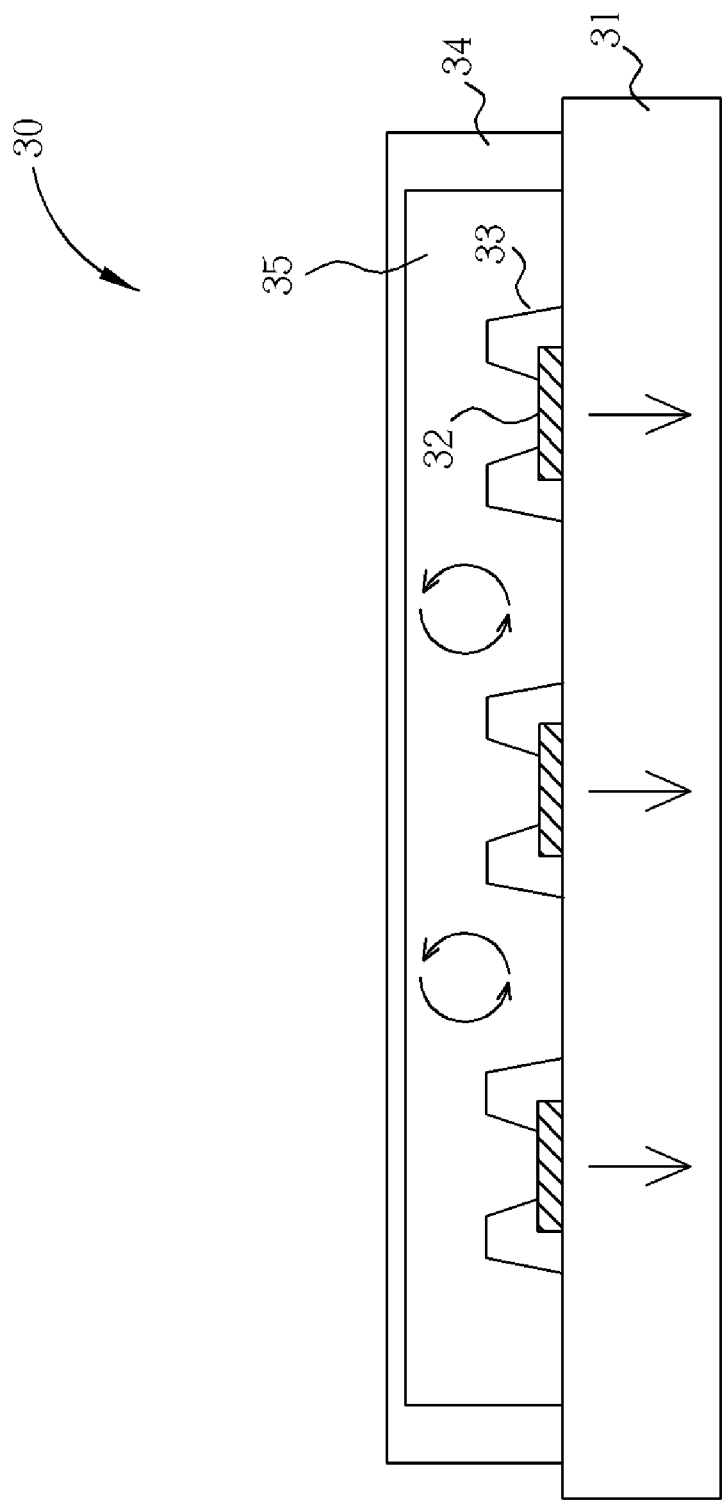
FIG. 3 is a schematic cross-sectional diagram showing an LED module according to an embodiment of the present invention.
Figure 4:
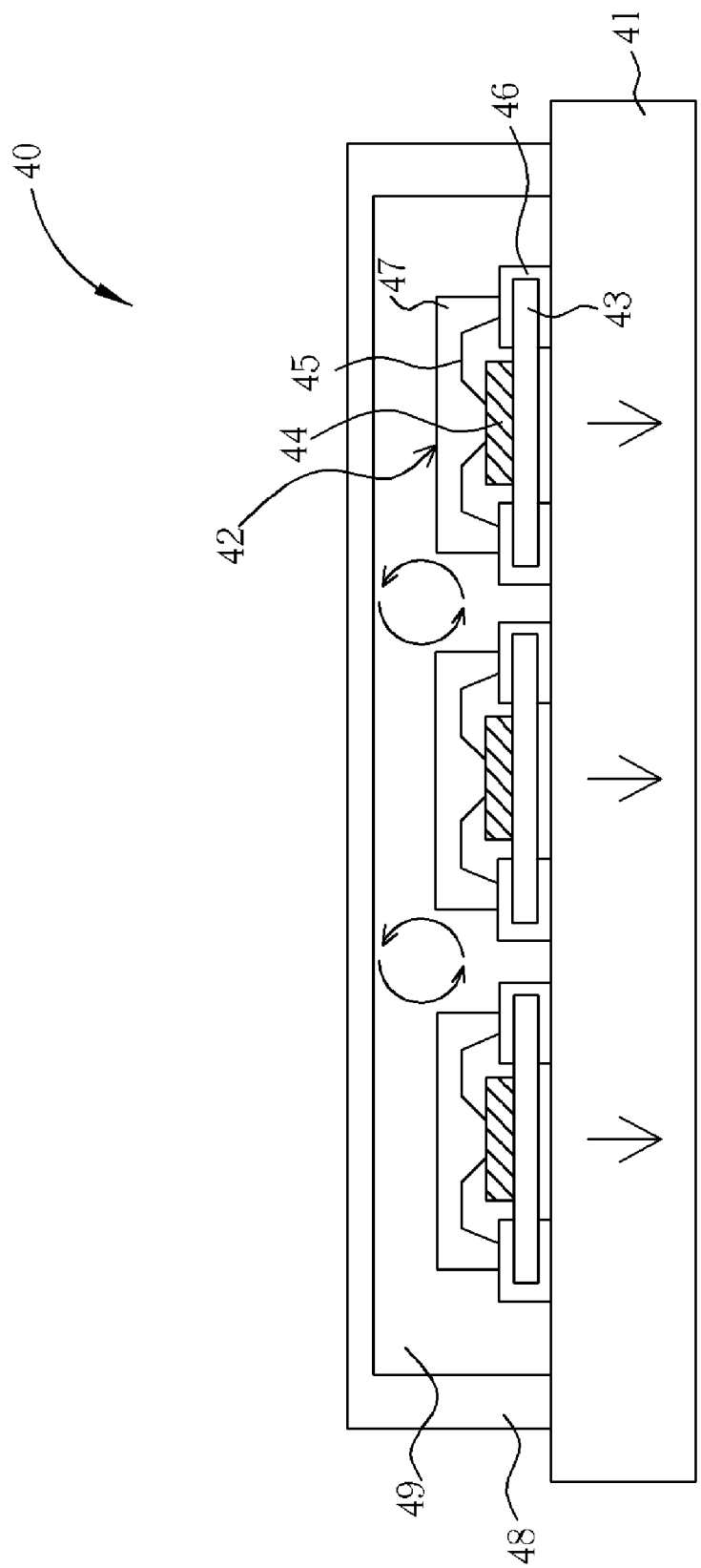
FIG. 4 is a schematic cross-sectional diagram showing an LED module according to another embodiment of the present invention.

Please refer to FIGS. 3 and 4. FIGS. 3 and 4 are each a schematic cross-sectional diagram showing an LED module of an embodiment according to the present invention, respectively. The light emitting elements suitably used in the light modules are not limited to a particular type. Herein, the light module including LED chips or LED package bodies as light-emitting elements is described for illustration. As shown in FIG. 3, the light module 30 according to the present invention comprises a substrate 31, at least one LED chip 32 as a light-emitting element, a sealing cap 34, and a fluid 35.

The substrate 31 may be a heat transferring plate with heat conductivity or further with electric conductivity. One or more LED chips 32 are disposed on the substrate 31 and electrically connected with, for example, conductive wires 33. A plurality of LED chips for emitting a single color light may be used to increase light intensity. Also, a plurality of LED chips for emitting different color lights, such as red light diode chips, green light diode chips, and blue light diode chips, may be used to achieve a light mixing effect.

The sealing cap 34 is disposed on the substrate 31 and covers the LED chips 32. The sealing cap 34 may comprise a singular material layer or a composite material layer with one or more transparent or light transmissive material, such as, silicone, glass, ceramics, epoxy resins, polyimide, or B-staged bisbenzocyclobutene. Materials with good light transmission and good light resistance are preferred, depending on the desired.

The fluid 35 is disposed in a space formed among the sealing cap 34, the LED chips 32, and the substrate 31 and may be a liquid, gas, fluidized solid, or a combination thereof, as long as a free flow and heat conductivity can be achieved. For example, a fluid with properties of light transmission (good light transmission is preferred) and electric insulation (for prevention of electric leakage) may be used. Light transmissive fluids with good heat resistance and light resistance (anti-UV light) are preferred. Silicone oil is one example among them. The fluid material may be selected to have a refractive index between the refractive index of the sealing cap material and the refractive index of the LED chip or the encapsulating material, to avoid the light intensity loss due to light reflection and increase the light module efficiency. Wavelength converting material particles, such as, fluorescent material powders, diffuser particles, or anti-UV light agents, may be further included in the fluid 35 as desired.

In another embodiment according to the present invention, as shown in FIG. 4, the light module 40 comprises a substrate 41, at least one LED package body 42 as a light-emitting element, a sealing cap 48, and a fluid 49. The substrate 41, sealing cap 48, and fluid 49 are as described above. The LED package body 42 may be a conventional LED package comprising, for example, a substrate 43, an LED chip 44, electric conducting wires 45, and an electric conducting layer 46, in addition to an encapsulating material layer 47. The encapsulating material layer 47 is a light transmissive solid and may be formed as a singular material layer or a composite material layer with silicone, glass, ceramics, epoxy resins, polyimide, or B-staged bisbenzocyclobutene.

In the manufacturing of the light module according to the present invention, one or more light-emitting elements may be disposed on the substrate and be connected by conductive wires. Next, a sealing cap previously molded is installed on the substrate to cover the light-emitting elements. Subsequently, a fluid may be injected into the space among the sealing cap, the light emitting elements, and the substrate via an injection hole on the sealing cap. Finally, the injection hole is sealed with a sealant.

The substrate of the present invention may have a flat surface and each light-emitting element is disposed on the surface, or a recess and each light-emitting element is disposed on the recess surface. Accordingly, the substrate surface is not particularly limited to be in a certain shape. The light emitting elements and the sealing cap may be disposed on the substrate according to the shape of the substrate, as desired.

In view form the above mentioned structure of the light module according to the present invention, since a fluid material is disposed in the space between the sealing cap and the light emitting element and the substrate, the fluid has a fluidity for free flowing. As shown in FIGS. 3 and 4, the heat flow is schematically illustrated by the arrow sign. Heat generated form the chips or light emitting elements can be dissipated into the ambient environment via the upper part of the light module by means of the fluid flow. In comparison with the conventional package structure in which heat is dissipated only via the bottom substrate, the light module according to the present invention has an additional heat dissipation path at the upper position to accelerate the heat dissipation. Accordingly, the volume of the bottom substrate or the heat dissipation facilities can be reduced to decrease the entire light module size. Furthermore, because the fluid is used, the pushing force on the electric conductive wires by the fluid is reduced, and thereby the stress is little. Thus, the lifetime and the reliability of the light module are enhanced.

Conventional encapsulating material tends to be deteriorated or yellowing, due to the radiation or the heat generated from the adjacent chips. In the present invention, the fluid, such as silicone oil, is used instead. In comparison with the epoxy resin generally used in conventional light modules, the fluid is not easily susceptive to yellowing. Furthermore, because the fluid can flow, once a small part of the fluid begins yellowing, the yellowing part of the fluid can be diluted through mixing by means of the fluid flow, and thus the yellowing coarse is prolonged.

If the yellowing of the fluid gets serious at last, the fluid packed inside the light module can be renewed, to extend lifetime of the light module. This advantage will be particularly remarkable when the light module is a high power or big sized LED module. In the light module according to the present invention, a solid sealing cap in combination with fluid materials are used as the encapsulating material or packaging material for the packaging or encapsulating, and hence, the light module, such as the LED module, has an increased reliability and lifetime. The light module according to the present invention may have many variations and modifications as desired and can be applied in a general illumination, LCD back light modules, vehicle illumination, and decoration illumination, etc. with different sizes or shapes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light module, comprising:
   a substrate;
   at least one light-emitting element on the substrate;
   a sealing cap on the substrate and covering the light-emitting elements; and
   a fluid in a space formed among the sealing cap, the light-emitting elements, and the substrate, wherein the fluid further comprises wavelength-converting material particles, diffuser particles, or anti-UV agents.

2. The light module of claim 1, wherein the light module comprises a plurality of light-emitting elements on the substrate and the light-emitting elements are light-emitting diode chips electrically connected to each other.

3. The light module of claim 2, wherein the light-emitting diode chips comprise a red light-emitting diode chip, a green light-emitting diode chip, and a blue light-emitting diode chip.

4. The light module of claim 1, wherein the light module comprises a plurality of light-emitting elements on the substrate and the light-emitting elements are light-emitting diode package bodies electrically connected to each other.

5. The light module of claim 4, wherein the light-emitting diode package bodies comprise a red light-emitting diode package body, a green light-emitting diode package body, and a blue light-emitting diode package body.

6. The light module of claim 1, wherein the fluid comprises a transparent fluid having properties of heat resistance and light resistance.

7. The light module of claim 6, wherein the fluid comprises silicone oil.

8. The light module of claim 1, wherein the substrate has heat conductivity.

9. The light module of claim 1, wherein the sealing cap comprises transparent material.

10. The light module of claim 1, wherein the sealing cap comprises a single material layer or a composite material layer formed from one or more selected from the group consisting of silica gel, glass, ceramics, epoxy resin, polyimide, and B-staged bisbenzocyclobutene polymer.

11. The light module of claim 1, wherein the substrate has a recess, and the light-emitting element is positioned on the recess.

12. The light module of claim 4, wherein the light-emitting package bodies each have a capsulation material layer.

13. The light module of claim 12, wherein the capsulation material layer comprises a single material layer or a composite material layer formed from one or more selected from the group consisting of silica gel, glass, ceramics, epoxy resin, polyimide, and B-staged bisbenzocyclobutene polymer.

14. A light module, comprising:
a substrate;
a plurality of light-emitting diode package bodies on the substrate, wherein the light-emitting diode package bodies are electrically connected to each other;
a sealing cap on the substrate and covering the light-emitting elements; and
a fluid in a space formed among the sealing cap, the light-emitting elements, and the substrate.

15. The light module of claim 14, wherein the light-emitting diode package bodies comprise a red light-emitting diode package body, a green light-emitting diode package body, and a blue light-emitting diode package body.

16. The light module of claim 14, wherein the fluid comprises a transparent fluid having properties of heat resistance and light resistance.

17. A light module, comprising:
a substrate;
a plurality of light-emitting elements on the substrate and the light-emitting elements are light-emitting diode package bodies electrically connected to each other;
a sealing cap on the substrate and covering the light-emitting elements; and
a fluid in a space formed among the sealing cap, the light-emitting elements, and the substrate,
wherein the substrate has a recess, and the light-emitting element is positioned on the recess.

* * * * *